(12) United States Patent
Berryman

(10) Patent No.: US 7,632,537 B2
(45) Date of Patent: Dec. 15, 2009

(54) CIRCUITS INCLUDING A TITANIUM SUBSTRATE

(75) Inventor: Walter Henry Berryman, Croydon (AU)

(73) Assignee: Hybird Electronics Australia Pty Ltd., Victoria (AU)

( * ) Notice: Subject to any disclaimer, the term of this patent is extended or adjusted under 35 U.S.C. 154(b) by 722 days.

(21) Appl. No.: 10/694,888

(22) Filed: Oct. 29, 2003

(65) Prior Publication Data

US 2004/0139598 A1 Jul. 22, 2004

(30) Foreign Application Priority Data

Oct. 30, 2002 (AU) .............................. 2002952359
Jan. 20, 2003 (AU) .............................. 2003900272

(51) Int. Cl.
*B05D 5/12* (2006.01)

(52) U.S. Cl. .................... 427/98.4; 427/99.2; 427/101; 427/103; 427/377

(58) Field of Classification Search ................. 427/101, 427/103, 402, 98.4, 99.2, 377; 29/610.1, 29/620, 621.1
See application file for complete search history.

(56) References Cited

U.S. PATENT DOCUMENTS

| | | | | |
|---|---|---|---|---|
| 2,959,503 A | * | 11/1960 | Lindson ...................... | 148/670 |
| 5,831,512 A | * | 11/1998 | Wienand et al. .............. | 338/25 |
| 6,054,173 A | * | 4/2000 | Robinson et al. ........... | 427/97.2 |
| 6,551,720 B2 | * | 4/2003 | Sreeram et al. ............. | 428/469 |

FOREIGN PATENT DOCUMENTS

DE    3838598    * 5/1990

* cited by examiner

*Primary Examiner*—Brian K Talbot
(74) *Attorney, Agent, or Firm*—Birch, Stewart, Kolasch & Birch, LLP

(57) ABSTRACT

A process is disclosed for manufacturing a thick-film circuit such as a hybrid circuit on a titanium or titanium-alloy substrate. The process includes firing a glassy dielectric layer upon at least one surface of the substrate. A thick-film circuit including a titanium or titanium-alloy substrate is also disclosed.

10 Claims, 1 Drawing Sheet

CIRCUITS INCLUDING A TITANIUM SUBSTRATE

BACKGROUND OF THE INVENTION

1. Field of the Invention

The present invention relates to electronic circuits. In particular the invention relates to electronic circuits including thick-film hybrid circuits that are constructed on or include a metal substrate.

2. Description of Background Art

Electronic circuits and sub-assemblies can be manufactured using thick-film hybrid-circuit technology. The substrate, or base, for such circuit technology is typically a flat, rigid sheet of electrically-insulating or insulated material. Resistors and interconnecting conductors or tracks are printed onto the substrate, typically by screen printing with special inks, pastes or compositions, which are then fused by firing at a high-temperature. Insulating layers, of materials such as glass, are similarly printed and fired, either to separate different layers of conductors, or to make dielectric layers for capacitors. Semiconductor devices, such as transistors, diodes and integrated circuits, and passive electronic components may be attached to the conductive tracks to provide further electronic functions. A combination of printed thick-film components and semiconductor devices makes up a complete structure encompassed by the term "hybrid circuit". The fired inks or compositions make up the "thick film" referred to in the phrase "thick-film hybrid circuit".

In hybrid-circuit manufacture generally, thermal-expansion properties of various materials used to construct the circuit should be relatively similar. When a layer of ink is printed onto a substrate and fired, and the thermal coefficient of expansion (TCE) of the fired ink differs substantially from that of the substrate, the whole circuit may be subjected to bending forces as its temperature changes. This may cause noticeable curvature in the finished product. Bending may also be sufficient to interfere with the process of printing further layers of ink or dielectric material after the first layer has been printed and fired. Even in cases where visible bending is not apparent, stresses set up by temperature changes may cause cracking in glass layers, or changes in the resistance values of thick-film resistors.

The extent of bending, that results from a given temperature rise and given disparities in TCEs of the various layers, also depends on the thickness of the layers and the moduli of elasticity of the materials used therein. In some hybrid-circuit applications, such as a pressure transducer, the thickness of the substrate layer may be important because the substrate is also a diaphragm, and is subject to additional bending under influence of differential pressure that is to be measured. In high-pressure measurement, the ultimate yield strength of the material may set a minimum thickness for the substrate. In other hybrid-circuit applications, such as a temperature-transducer or calorimetric flow-transducer, the thickness of the substrate layer may be important because thermal resistance through the substrate, transversely or radially, is an integral factor in the operation of such a transducer. In these cases, thermal conductivity of the substrate material may also be important.

Metals and alloys such as stainless steel have been used as hybrid-circuit substrate materials (eg. refer U.S. Pat. No. 6,233,817), particularly for heating elements and associated electronic circuits. In applications such as pressure sensing, titanium has an advantage of high yield strength relative to its modulus of elasticity. In other applications, such as calorimetric flow sensing, titanium and its alloys may provide a relatively wide range of thermal conductivity, allowing some control over heat conduction both through a diaphragm and radially to a supporting structure or a temperature-sensor.

Although titanium substrates have previously been proposed they have not found widespread application. Also, while dielectric and resistive inks exist that are specifically designed for use with stainless steel hybrid-circuit substrates, there is no such established range of inks available specifically for use with titanium.

SUMMARY OF THE INVENTION

The present invention may provide a process for manufacturing thick-film hybrid electronic circuits on or including titanium or titanium-alloy substrates. The present invention may also provide an electronic circuit such as a thick film hybrid circuit that includes or is constructed upon a titanium metal or titanium alloy substrate.

According to one aspect of the present invention there is provided a process for manufacturing a thick-film circuit on a titanium or titanium-alloy substrate including firing a glassy dielectric layer upon at least one surface of said substrate.

According to a further aspect of the present invention there is provided a thick-film circuit including a titanium or titanium-alloy substrate having a glassy dielectric layer fired upon at least one surface of said substrate. The thick film circuit may include a hybrid circuit.

The substrate may be coated with one of more layers of fired insulating composition, to form the base upon which conductive or resistive inks and further insulating layers may be printed to produce the thick-film hybrid circuit. Throughout the specification, the term "titanium" is to be interpreted to include titanium-based alloys, as well as various "commercially pure" grades of titanium metal.

The present invention may include a process that allows dielectric layers and conductive inks to be fired without causing excessive curvature of the substrate. The present invention may also include a process that promotes good adhesion between the dielectric layers and the substrate.

The process may include diffusing lead through titanium oxides on the or each surface of the substrate to form a relatively strong bond between the substrate and the dielectric layer immediately adjacent to it. The process may include firing additional layers of similar or different dielectric material on top of the dielectric layer immediately adjacent the substrate.

The process may include selecting materials and layer-thicknesses according to their temperature coefficients of expansion and Young's modulus to control bending of the substrate. The process may include placing a layer of dielectric material on a reverse side of the substrate to inhibit growth of oxide during the firing. The process may include removing the dielectric layer placed on the reverse-side after at least some of the firing is complete. Alternatively, the dielectric layer placed on the reverse-side may be left in place after the firing is complete.

The process may include modifying temperatures of firing of various layers to control bending of the finished thick-film circuit. The process may include arranging dielectric layers upon which one or more elements of the circuit is printed on the substrate, including layers that are or may be printed on top of the or each element, to control temperature coefficient of resistivity of the or each element. The or each circuit element may include one or more of a resistor, thermistor and strain gauge. When the thick-film circuit includes a strain gauge, the process may include the step of adjusting proportions of different dielectric inks, and mixing the inks together before firing same to produce a layer or layers upon which the strain-gauge is printed and fired to control temperature coefficient of resistivity of the strain gauge.

Materials used in manufacturing thick-film hybrid-circuits that are constructed on or include a metallic substrate should be fairly similar, at least in terms of their thermal-expansion coefficients to avoid relatively high mechanical stresses being produced in the materials as the circuit cools after printed layers of the circuit are fired. If the stresses are not controlled, they will cause bending of the manufactured circuit, and this may cause fracture of glass-like layers formed during the firing. Furthermore, stresses which build up in resistive layers may cause unwanted variations in electrical properties of resistors within a manufactured circuit.

One aspect of the present invention may identify processing steps and combinations of commercially-available materials that may be compatible with thermal-expansion properties associated with titanium substrates. It may be noted that various grades of titanium and its alloys may provide a relatively wide range of temperature coefficients of expansion, so that there may not be a unique recipe that fits all cases. Also, the temperature coefficient of expansion is not constant over the range between ambient room temperature and the firing temperature. In other words, expansion is nonlinearly related to temperature. As far as substrate bending and thermally-induced stresses are concerned, one problem is relative contractions that occur as the materials cool towards ambient temperature from a solidification-point of each glassy layer.

Titanium metal surfaces are normally covered with a thin oxide layer, which protects the metal from further corrosion. The oxide closest to the metal has a different composition to that in contact with the atmosphere. When titanium is heated in a furnace, during manufacture of a thick-film hybrid circuit, the oxide layer grows in thickness.

When dielectric pastes are printed onto a titanium substrate and fired in a furnace, typically at temperatures of 800 to 850° C., the paste fuses into a glassy layer. More than one such layer may be used, to provide high dielectric strength, for example. Some components of the dielectric material may diffuse through the titanium oxide layer during firing. Another effect, seen with some dielectric materials, is formation of voids at the interface between the fused dielectric and the titanium or titanium oxide layer. Generally, the formation of voids is undesirable, as it may lead to poor adhesion between the dielectric and the substrate. Diffusion of dielectric components, such as lead compounds, on the other hand may be beneficial in promoting adhesion.

When the fired substrate is cooled, some strain relief occurs in titanium due to annealing, in the range 500 to 600° C.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
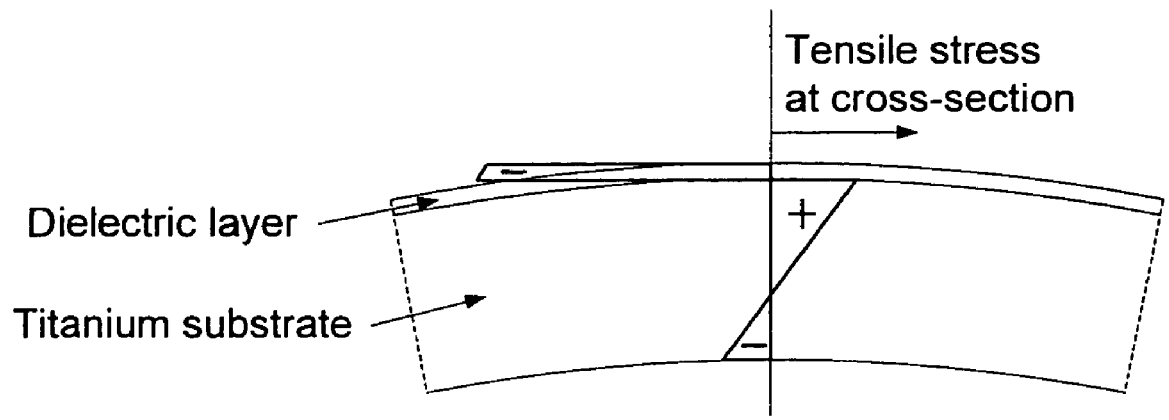
FIG. 1 is a graphical representation of stress across a cross-section of a cooled circuit.

The present invention provides a process by which desirable properties in the manufacture of a thick-film hybrid circuit on a titanium substrate may be achieved.

EXAMPLES

In one example a first step is to print and fire a dielectric ink, typically one such as Metech 7600A, on a cleaned titanium surface. The resulting dielectric is a glassy material with some lead content. During firing, some of the lead may diffuse through the oxide and into the titanium surface, providing a mechanically strong bond between the dielectric and the substrate. This interface-layer composition has been verified by scanning electron microscopy of sample cross-sections. The dielectric mentioned above is intended by its manufacturer for use on alumina substrates, and its temperature coefficient of expansion is about $7 \times 10^{-6}$ per ° C., and is approximately matched to that of alumina (about $6.4 \times 10^{-6}$ per ° C.).

The strength of the dielectric-to-titanium bond has been verified by the following "peel" test. A large component, such as a tab-mounted integrated-circuit voltage regulator, is soldered to a conductive pad printed and fired on a completed hybrid circuit. Mechanical force is then applied to separate the component off the hybrid circuit, and the circuit is inspected to determine where separation has occurred: dielectric-to-substrate, between dielectric layers, dielectric-to-conductor, or conductor-to-solder. The amount of force required to separate the layers is an indication of the bond strength between the layers that separate.

A second dielectric layer is then printed and fired on top of the first. Typically this is a material such as Electro-Science Laboratories' insulating composition 4924, which is intended for use in manufacturing of heating elements, deposited on stainless steel grade 430. One reason for choosing this material is that its temperature coefficient of expansion, (approximately $8 \times 10^{-6}$ per ° C.) is a better match to that of titanium and its alloys (about $9.7 \times 10^{-6}$ per ° C. over 20° to 500° C.) than the temperature-coefficients of dielectrics designed for use on alumina substrates. Another reason is that conductors printed on top of 4924 dielectric have good adhesion to it. More than one layer of 4924 material can be successively printed and fired, depending on final dielectric thickness and dielectric strength required.

In some applications, choice of dielectric material may be important because it affects temperature coefficient of resistivity of circuit elements, such as resistors, thermistors and strain gauges, printed and fired on top of the dielectric layers. The present invention may enable relatively close control of properties of such circuit elements. Selection and layering of dielectric materials may be used to control and to tailor these properties. Dielectric material may also be printed on top of printed circuit elements, typically as a protective layer. When a top dielectric is used, it may also be part of a mechanism for controlling temperature coefficients of underlying circuit elements.

Because temperature coefficients of both dielectric materials are lower than that of titanium, it may be expected that after cooling, a dielectric-coated face of the substrate would be convex as illustrated in FIG. 1. Convexity should be due to the titanium substrate contracting more than the dielectric layers as it cools, so that the titanium would be mainly in tension and the dielectric would be wholly in compression.

FIG. 1 includes a graphical representation of an idealised distribution of stress across a cross-section of the cooled circuit.

Figure 2:
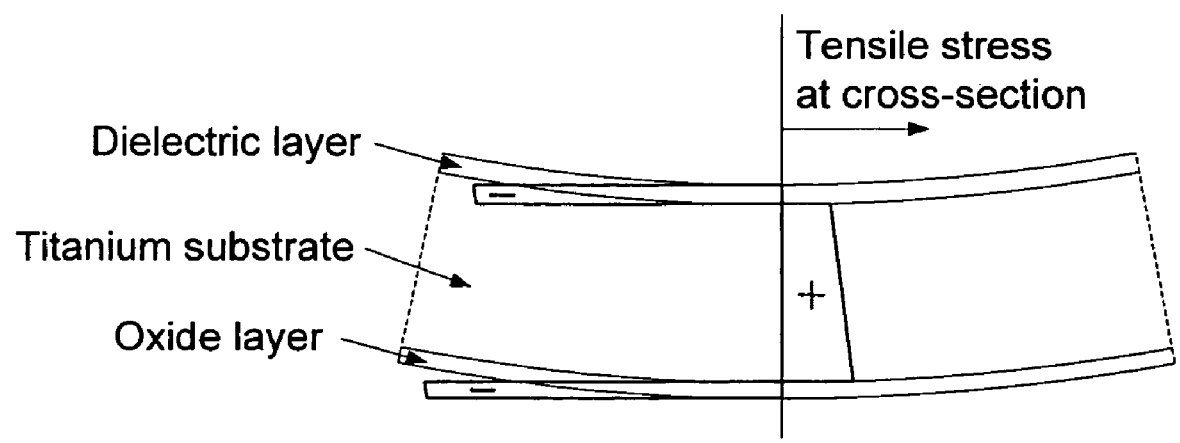
FIG. 2 is a representative stress distribution.

In practice, it is found that a hybrid circuit manufactured as described above may curve in the opposite direction to that shown in FIG. 1. This is evidently due to formation of an oxide layer on the bottom surface of the titanium when it is fired. Images obtained from secondary electron microscopy confirm that a $TiO_2$ layer, typically of 10 μm thickness, is formed during the first firing. Repeated firings, required to form additional layers of dielectric or other materials on the top surface, cause the thickness of the bottom-surface oxide layer to increase. Reported values for the temperature coefficient of expansion of titanium dioxide vary (refer Lynch et al, "Engineering Properties of Selected Ceramic Materials", American Ceramic Society, Columbus, Ohio, 1966), but is about $8.8 \times 10^{-6}$ per ° C. This is significantly below that of titanium. FIG. 2 shows a representative stress distribution for this situation.

In order to prevent growth of oxide on the bottom surface of the substrate, the present invention may include use of a layer of material, such as a dielectric ink, to coat the bottom surface or reverse side of the substrate.

This bottom-surface coating layer may be used in either of two ways. Firstly, it may be regarded as a sacrificial layer, the sole purpose of which may be to prevent growth of bottom-surface oxide during firing of the top-surface layers. In this case, the sacrificial layer may be removed after the sequence of firings is complete. The sacrificial layer may be removed using abrasive or chemical means.

Alternatively, the bottom-surface coating layer may be left in place after completion of the firing-sequence, becoming part of the finished hybrid-circuit device. In this case, residual stresses in the bottom layer, as well as those in the top layers and the substrate itself, may determine the radius of bending in the finished device.

Experiments have shown that the degree of bending that results from firing and cooling depends to some extent on the temperature at which firing is performed. While it is common to fire dielectric materials at 850° C., noticeably reduced bending is obtained with a firing temperature of 800° C., which is still high enough for some dielectric materials. The present invention may include manipulation of firing temperature as an additional means of controlling bending of manufactured thick-film circuits on titanium substrates. Some further control over bending and stress distribution may be obtained by additional annealing of the substrate after firing.

When strain gauges are printed and fired on top of dielectric layers, the temperature coefficient of resistance of the gauges preferably are small in magnitude, because variation of resistance due to strain tends to be confounded by resistance-variation of due to temperature-change. For example, it has been found that printing ESL strain-gauge ink type 3414A on top of ESL dielectric 4924 over a titanium substrate produced a higher resistivity than the same material printed on alumina. The temperature coefficient of resistance was about $-150 \times 10^{-6}$ per ° C. Printing the same strain-gauge ink on top of Metech dielectric type 7600A over titanium produced a lower resistivity than on alumina, but with a positive temperature coefficient of about $200 \times 10^{-6}$. Mixing the two dielectric pastes gave an intermediate result, with the implication that the temperature coefficient of thick-film strain-gauges can be reduced to a low magnitude by controlling the proportions of these or other dielectric materials.

The present invention may utilize the relatively wide range of properties available in both commercially pure titanium and titanium-based alloys, so that a relatively optimum combination of physical properties can be chosen for a particular application.

Preferred forms of the invention may provide hybrid circuits for transducers used to sense temperature, fluid flow, strain or pressure, but are not restricted to such applications. Such transducers may use the metal substrate in a dual role. Firstly, the substrate may constitute a diaphragm whose mechanical and/or thermal properties may play an integral part in sensing a measured quantity. Secondly, the substrate may constitute a base for printing electronic circuits used to amplify or process the electrical signals generated in the transducer, or other circuits associated with the transducer application.

The use of a substrate material such as titanium or titanium alloy may at least improve the match between the thermal coefficient of expansion (TCE) of the substrate and elements or materials used to manufacture the circuit, for example commercially available hybrid circuit inks for ceramic substrates such as Metech 3504 (Silver Palladium conductor), Tanaka TR-4920 (Silver Palladium conductor), ESL 9695 (Silver Palladium conductor), resistor compositions such as Metech 9100D and insulating compositions such as Metech 7600A. Such commercially available inks may be used with titanium or titanium alloy substrates due to the relatively closely matching properties of titanium when compared with ceramics.

An improved match between the TCEs of the substrate and other elements of the circuit may reduce the bending and stress-magnitudes of a completed thick-film hybrid circuit formed on a metal substrate. With a suitably-chosen grade of titanium, the TCE of the metal is closer to that of alumina than is the TCE of stainless steel grade 430. A numerical comparison is given in Table 1, fourth column. This means that, for many purposes, inks and dielectric materials that would be used commercially on ceramic substrates can be printed on an insulation-coated titanium substrate, without producing as much thermal bending stress as would result from using the same materials on stainless steel of comparable thickness. This may be important, not only because the mechanical effect of bending, but also because the surface strain associated with bending affects the resistance and stability of resistive materials printed and fired on the substrate. Due to the greater range of commercially available inks and dielectric materials for use on ceramic substrates, use of a titanium or titanium alloy substrate (which more closely matches properties of a ceramic substrate) may also reduce temperature dependence of resistors printed and fired on such a substrate.

TABLE 1

| Material | Minimum yield strength, 0.2%, MPa | Modulus of Elasticity, GPa | Coefficient of thermal expansion, $°K^{-1}$ (TCE) | Thermal Conductivity, $W \cdot m^{-1} \cdot K^{-1}$ @ 100° C. | Electrical resistivity, $\Omega \cdot m$ |
|---|---|---|---|---|---|
| Stainless steel 430 | 205 | 200 | $10.4 \times 10^{-6}$ | 23.9 | $0.60 \times 10^{-6}$ |
| Stainless steel 316L | 170 | 193 | $15.9 \times 10^{-6}$ | 16.3 | $0.74 \times 10^{-6}$ |

TABLE 1-continued

| Material | Minimum yield strength, 0.2%, MPa | Modulus of Elasticity, GPa | Coefficient of thermal expansion, $°K^{-1}$ (TCE) | Thermal Conductivity, $W \cdot m^{-1} \cdot K^{-1}$ @ 100° C. | Electrical resistivity, $\Omega \cdot m$ |
|---|---|---|---|---|---|
| Titanium Grade 3 | 380 | 105 to 120 | $8.6 \times 10^{-6}$ | 21.79 | $0.54 \times 10^{-6}$ |
| Titanium Grade 4 | 483 | 105 to 120 | $8.6 \times 10^{-6}$ | 16.95 | $0.60 \times 10^{-6}$ |
| Titanium Grade 5 | 825 | 107 to 122 | $9.0 \times 10^{-6}$ | 6.6 | $1.68 \times 10^{-6}$ |
| Alumina 96% | | | $6.4 \times 10^{-6}$ | 26 | |

A further benefit of the use of a titanium or titanium alloy substrate material is that, by choosing an appropriate grade of titanium, the ratio of yield strength to modulus of elasticity can be much higher than for stainless steel. Table 1 compares two grades of stainless steel with two grades of titanium, based on AISI and as ASTM (American Society for Testing and Materials) specifications. In applications such as pressure transducers, the relatively high yield strength of these grades of titanium allows thinner diaphragms to be used without performance degradation or diaphragm failure due to yield. Pressure transducers generally operate on the principle of detecting strain at the surface of a diaphragm, using the change of resistance of one or more strain gauges, or using piezo-electric strain sensing. Reducing the diaphragm thickness increases the degree of surface strain associated with bending under a given pressure, and reducing the modulus of elasticity further increases the surface strain for a given pressure. The sensitivity of a pressure transducer based on an insulated metal-diaphragm thick-film hybrid circuit, using titanium or titanium alloy as the substrate material may therefore be enhanced.

A further benefit of the use of a titanium or titanium alloy substrate material is that it may be highly resistant to corrosion in a wide range of environments. As mentioned earlier, when stainless steel is used as a hybrid-circuit substrate, grade 430 is preferred because its low TCE can be matched with insulating compositions and resistive and conducting inks. Grade 316L is more desirable from a corrosion point of view, but its TCE is 50% higher, and its thermal conductivity is ⅔ that of 430. A good dielectric thermal match with 316L is not currently available. Replacing the stainless steel with titanium grade 3, good corrosion resistance can be combined with a lower TCE and almost the same thermal conductivity as grade 430 stainless steel. The corrosion-resistance of a transducer based on an insulated metal-diaphragm thick-film hybrid circuit, may therefore be enhanced by using titanium or titanium alloy as the substrate material.

A further benefit of the use of a titanium or titanium alloy substrate material is that it may avoid diffusion of iron contamination, from the metal substrate into the main insulating layer(s) of a thick film hybrid circuit on to which circuit elements are printed. Diffusion of iron from a steel or stainless steel substrate, during firing of the insulating layer, tends to degrade the breakdown voltage of the insulating layer. This may be minimized by the use of additional insulating layers, or by the use of a protective noble-metal layer under the insulating layer. Both these methods require additional manufacturing steps, compared with the present invention.

A further benefit of the use of a titanium or titanium alloy substrate material is that the wide range of properties available in different grades of titanium (both commercially pure grades and alloys) may allow thermal and mechanical properties of the metal substrate to be tailored to satisfy particular requirements arising in a wide range of potential applications of metal-substrate based thick-film hybrid technology, including but not restricted to, particular requirements of transducers based on metal-substrate thick-film hybrid technology, used to measure temperature, fluid flow, differential pressure and mechanical strain.

Examples of Typical Customer Requirements and Titanium Optimisation are set forth below:

Customer 1 (pump sensor) requires
High thermal conductivity for triac heat sinking into water
High strength for high pressure water
Low Young's modulus for pressure measurement sensitivity
No bending during manufacture
In these circumstances it is desirable to choose Titanium Grade 3

Customer 2 (battery operated flow sensor) requires
Low thermal conductivity for minimum heat loss
Minimum thickness for lowest power and fast response
High strength for water pressure specification
In these circumstances it is desirable to choose Titanium Grade 5

A further benefit of the use of a titanium or titanium alloy substrate material is that presently-available resistive inks are suitable for use on top of the insulating layers that are compatible with the titanium substrate. Presently available resistive inks are not suitable for use on top of the insulating layers formulated for stainless steel substrates. A special interface dielectric may be used as an intermediate layer between the stainless-steel insulating layer and the resistive inks, but this requires additional processing during manufacture.

Finally, it is to be understood that various alterations, modifications and/or additions may be introduced into the constructions and arrangements of parts previously described without departing from the spirit or ambit of the invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A process for manufacturing a thick-film circuit having at least one element on a titanium or titanium-alloy substrate to substantially prevent formation of a bent substrate comprising the steps of:

applying a glassy dielectric layer upon at least one surface of said substrate, the composition and layer thickness of which are selected according to its temperature coefficients and Young's modulus to substantially prevent bending of the substrate after it has cooled to ambient temperature;

firing said glassy dielectric layer in an oxidizing atmosphere; and forming at least one element of said thick-film circuit upon said dielectric layer; wherein the composition and layer thickness of the at least one element is selected according to its temperature coefficient and Young's modulus to substantially prevent bending of the substrate after it has cooled to ambient temperature.

2. The process as claimed in claim 1 wherein said thick-film circuit includes a hybrid circuit.

3. The process, as claimed in claim 1 wherein said glassy layer includes lead content, said method further including the step of diffusing the lead through titanium oxides on the or each surface of said substrate to form a relatively strong bond between said substrate and the dielectric layer immediately adjacent to it.

4. The process as claimed in claim 1 further including the step of firing additional layers of similar or different dielectric material on top of the dielectric layer immediately adjacent said substrate.

5. The process as claimed in claim 1 further including the step of placing a layer of dielectric material on a reverse side of said substrate to inhibit growth of oxide during said firing.

6. The process as claimed in claim 5 further including the step of removing the dielectric layer placed on the reverse side after at least some of the firing is complete.

7. The process, as claimed in claim 1 further including the step of modifying temperatures of firing of a plurality of layers to control bending of said thick-film circuit.

8. The process, as claimed in claim 4 further including the step of arranging dielectric layers upon which the at least one element of said circuit is printed on said substrate, including layers that are printed on top of the at least one element, to control temperature coefficient of resistivity of the at least one element.

9. The process as claimed in claim 8 wherein the at least one element is selected from the group consisting of a resistor, thermistor and a strain gauge.

10. The process, as claimed in claim 1 wherein said thick-film circuit includes a strain gauge, said method further including the steps of providing a plurality of different dielectric inks, adjusting relative concentration of said dielectric inks, and mixing the inks together before firing same to produce a layer or layers upon which said strain-gauge is printed and fired to control temperature coefficient of resistivity of said strain gauge.

* * * * *